United States Patent
Kim et al.

(10) Patent No.: US 11,821,960 B2
(45) Date of Patent: Nov. 21, 2023

(54) APPARATUS AND METHOD FOR DIAGNOSING DEGREE OF DEGRADATION OF BATTERY

(71) Applicant: LG Energy Solution, Ltd., Seoul (KR)

(72) Inventors: Ji-Yeon Kim, Daejeon (KR); Young-Deok Kim, Daejeon (KR); Yoon-Jung Bae, Daejeon (KR)

(73) Assignee: LG Energy Solution, Ltd.

( * ) Notice: Subject to any disclaimer, the term of this patent is extended or adjusted under 35 U.S.C. 154(b) by 0 days.

(21) Appl. No.: 17/626,652

(22) PCT Filed: Nov. 26, 2020

(86) PCT No.: PCT/KR2020/016898
§ 371 (c)(1),
(2) Date: Jan. 12, 2022

(87) PCT Pub. No.: WO2021/118118
PCT Pub. Date: Jun. 17, 2021

(65) Prior Publication Data
US 2022/0373607 A1  Nov. 24, 2022

(30) Foreign Application Priority Data
Dec. 11, 2019 (KR) .......... 10-2019-0164890

(51) Int. Cl.
*G01R 31/392* (2019.01)
*G01R 31/3835* (2019.01)
(Continued)

(52) U.S. Cl.
CPC ....... *G01R 31/392* (2019.01); *G01R 31/3648* (2013.01); *G01R 31/3835* (2019.01); *H01M 10/44* (2013.01)

(58) Field of Classification Search
CPC .......................... G01R 31/3835; G01R 31/392
(Continued)

(56) References Cited

U.S. PATENT DOCUMENTS

2004/0001996 A1  1/2004  Sugimoto
2007/0252600 A1  11/2007  Chou et al.
(Continued)

FOREIGN PATENT DOCUMENTS

CN  102478636 A  5/2012
CN  105676692 A  6/2016
(Continued)

OTHER PUBLICATIONS

Extended European Search Report for Application No. 20899938.3 dated Aug. 2, 2022, pp. 1-4.
(Continued)

*Primary Examiner* — Ricky Go
(74) *Attorney, Agent, or Firm* — Lerner David LLP

(57) ABSTRACT

An apparatus for diagnosing a degree of degradation of a battery includes a measuring unit configured to measure a voltage of each of a plurality of battery cells in each of a plurality of cycles where charging and discharging is performed and output voltage information about the plurality of measured voltages, and a control unit configured to receive the plurality of voltage information, calculate a voltage deviation of each cycle for each battery cell based on a reference voltage of each of the plurality of battery cells, select a cycle section satisfying a predetermined condition for each of the plurality of battery cells based on the calculated voltage deviation, calculate a voltage deviation change rate corresponding to each of the plurality of selected cycle sections, and diagnose a relative degree of degradation of the plurality of battery cells based on the plurality of calculated voltage deviation change rates.

13 Claims, 6 Drawing Sheets

(51) Int. Cl.
*G01R 31/36* (2020.01)
*H01M 10/44* (2006.01)

(58) Field of Classification Search
USPC .......................................................... 702/64
See application file for complete search history.

(56) References Cited

U.S. PATENT DOCUMENTS

| | | | |
|---|---|---|---|
| 2012/0130655 A1* | 5/2012 | Mitsuda | G01R 31/392 |
| | | | 702/58 |
| 2012/0293131 A1 | 11/2012 | Nakamura et al. | |
| 2013/0282316 A1 | 10/2013 | Goto | |
| 2015/0234013 A1 | 8/2015 | Migita et al. | |
| 2016/0195589 A1 | 7/2016 | Hanyu et al. | |
| 2016/0299197 A1 | 10/2016 | Kim | |
| 2018/0292465 A1* | 10/2018 | Osara | G01N 33/2888 |
| 2019/0113577 A1 | 4/2019 | Severson et al. | |
| 2019/0198938 A1* | 6/2019 | Fujita | H02J 7/0029 |
| 2019/0317150 A1 | 10/2019 | Park et al. | |

FOREIGN PATENT DOCUMENTS

| | | |
|---|---|---|
| CN | 106054079 A | 10/2016 |
| CN | 106329632 A | 1/2017 |
| JP | 200431120 A | 1/2004 |
| JP | 2005322456 A | 11/2005 |
| JP | 4809618 B2 | 11/2011 |
| JP | 2013254664 A | 12/2013 |
| JP | 2015060761 A | 3/2015 |
| JP | 201570638 A | 4/2015 |
| JP | 2017073370 A | 4/2017 |
| JP | 2019100780 A | 6/2019 |
| JP | 2019113524 A | 7/2019 |
| KR | 101174714 B1 | 9/2012 |
| KR | 101488828 B1 | 2/2015 |
| KR | 101738601 B1 | 5/2017 |
| KR | 2017-0074832 A | 6/2017 |
| KR | 101882287 B1 | 7/2018 |
| KR | 102013306 B1 | 8/2019 |
| WO | 2011090020 A1 | 7/2011 |
| WO | 2012095894 A1 | 7/2012 |
| WO | 2013/179810 A1 | 12/2013 |

OTHER PUBLICATIONS

International Search Report for PCTKR2020/016898 dated Mar. 3, 2021, 2 pgs.

* cited by examiner

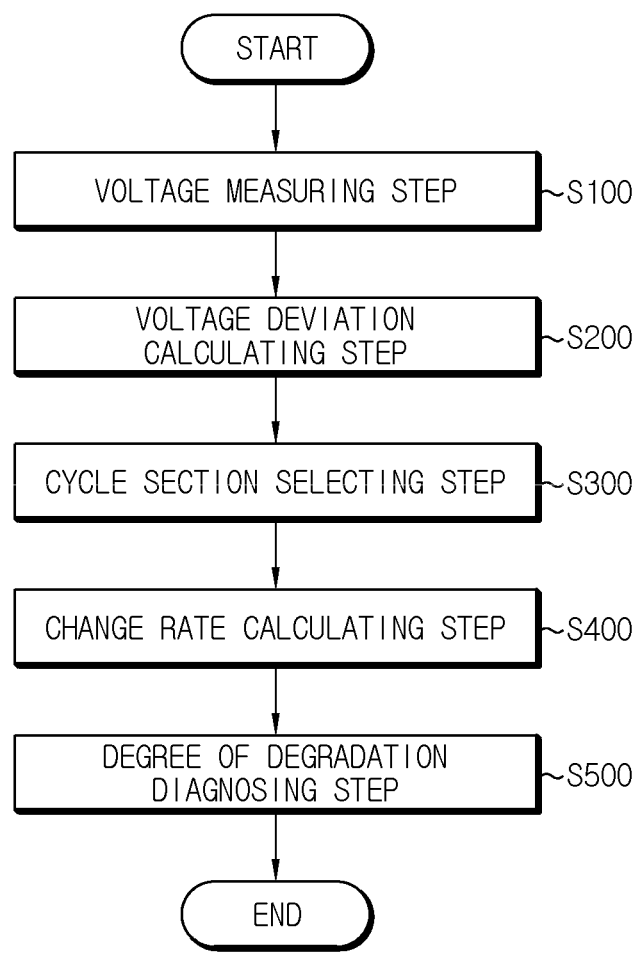

APPARATUS AND METHOD FOR DIAGNOSING DEGREE OF DEGRADATION OF BATTERY

CROSS-REFERENCE TO RELATED APPLICATIONS

The present application is a national phase entry under 35 U.S.C. § 371 of International Application No. PCT/KR2020/016898 filed Nov. 26, 2020, published in Korean, which claims priority from Korean Patent Application No. 10-2019-0164890 filed Dec. 11, 2019, all of which are incorporated herein by reference.

TECHNICAL FIELD

The present application claims priority to Korean Patent Application No. 10-2019-0164890 filed on Dec. 11, 2019 in the Republic of Korea, the disclosures of which are incorporated herein by reference.

The present disclosure relates to an apparatus and method for diagnosing a degree of degradation of a battery, and more particularly, to an apparatus and method for diagnosing a degree of degradation of a battery capable of diagnosing degree of degradation of a plurality of battery cells accurately and rapidly.

BACKGROUND ART

Recently, the demand for portable electronic products such as notebook computers, video cameras and portable telephones has increased sharply, and electric vehicles, energy storage batteries, robots, satellites and the like have been developed in earnest. Accordingly, high-performance batteries allowing repeated charging and discharging are being actively studied.

Batteries commercially available at present include nickel-cadmium batteries, nickel hydrogen batteries, nickel-zinc batteries, lithium batteries and the like. Among them, the lithium batteries are in the limelight since they have almost no memory effect compared to nickel-based batteries and also have very low self-discharging rate and high energy density.

Meanwhile, since the capacity of the battery gradually decreases as the battery is repeatedly charged and discharged, there is a risk that an unexpected accident may occur due to the decrease in capacity of the battery. Therefore, various studies are being conducted to estimate the lifespan or degree of degradation of a battery.

Conventionally, a battery life estimation method or apparatus for estimating a remaining life of a battery by estimating a State Of Health (SOH) of the battery has been disclosed (Patent Literature 1).

However, in Patent Literature 1, the SOH of the battery is estimated by measuring the amount of voltage increase when the battery is charged, and the remaining life of the battery is calculated from the estimated SOH using a statistical technique (e.g., particle filter), so is a problem that it takes a considerable amount of time to diagnose the remaining life or the degree of degradation.

(Patent Literature 1) KR 10-1882287 B1

SUMMARY

Technical Problem

The present disclosure is designed to solve the problems of the related art, and therefore the present disclosure is directed to providing an apparatus and method for diagnosing a degree of degradation of a battery, which may quickly and accurately diagnose the degree of degradation of a battery cell based on a measured voltage of the battery cell.

These and other objects and advantages of the present disclosure may be understood from the following detailed description and will become more fully apparent from the exemplary embodiments of the present disclosure. Also, it will be easily understood that the objects and advantages of the present disclosure may be realized by the means shown in the appended claims and combinations thereof.

Technical Solution

In one aspect of the present disclosure, there is provided an apparatus for diagnosing a degree of degradation of a battery, comprising: a a voltage sensor configured to: measure a voltage of each of a plurality of battery cells in each of a plurality of cycles where charging and discharging is performed, and output voltage information about the plurality of measured voltages of the plurality of battery cells in the plurality of cycles; and a control unit configured to: receive the voltage information, for each battery cell: for each cycle of the battery cell, calculate a voltage deviation based on a reference voltage of the battery cell[[s]] during the cycle, select a plurality of cycle sections among the plurality of cycles, each of the plurality of cycle sections satisfying a predetermined condition based on the plurality of calculated voltage deviations, and calculate a voltage deviation change rate corresponding to each of the plurality of selected cycle sections, and diagnose a relative degree of degradation of the plurality of battery cells based on the plurality of calculated voltage deviation change rates.

The voltage sensor may be configured to measure the voltage of the plurality of battery cells in response to passage of a predetermined amount of time after termination of discharging of the plurality of battery cells.

The voltage deviation may be a difference between a cell voltage of the battery cell and the reference voltage.

The predetermined condition may be an increase in the calculated voltage deviation or passage of a preset number of cycles from an initial cycle.

The control unit may be configured to calculate an average change rate of the voltage deviation corresponding to each of the plurality of selected cycle sections.

The control unit may be configured to diagnose a relative degree of degradation of the plurality of battery cells based on a comparison of the respective average change rates calculated for the plurality of battery cells.

An increase in the battery degree of degradation may correspond to an increase in the calculated voltage deviation change rate.

The control unit may be configured to divide the plurality of selected cycles into a plurality of unit sections, calculate an average section change rate of the voltage deviation for each of the plurality of divided unit sections, and diagnose a relative degree of degradation of the plurality of battery cells for each of plurality of unit sections, wherein for each unit section, the respective relative degree of degradation of the unit section is based on a result of comparing the average section change rates calculated for the unit section.

The control unit may be configured to select a target cell among the plurality of battery cells, divide a plurality of cycles corresponding to the selected target cell into a plurality of unit sections, calculate an average section change rate of the voltage deviation corresponding to each of the plurality of divided unit sections, and diagnose whether degradation of the target cell is accelerated based on a comparison of the calculated average section change rates.

The control unit may be configured to diagnose that degradation of the target cell has accelerated during a given unit section in response to the plurality of calculated average section change rates increasing as the plurality of cycles of the given unit section proceed.

In another aspect of the present disclosure, there is also provided a battery pack, comprising the apparatus according to any of the embodiments of the present disclosure.

In still another aspect of the present disclosure, there is also provided a method for diagnosing a degree of degradation of a battery, comprising: measuring a voltage of each of a plurality of battery cells in each of a plurality of cycles where charging and discharging is performed; for each battery cell: for each cycle of the battery cell, calculating a voltage deviation based on a reference voltage of the battery cell during the cycle; selecting a plurality of cycle sections among the plurality of cycles, each of the plurality of cycle sections satisfying a predetermined condition based on the calculated plurality of voltage deviations; and calculating a voltage deviation change rate corresponding to each of the plurality of selected cycle sections; and diagnosing a relative degree of degradation of the plurality of battery cells based on the plurality of calculated voltage deviation change rates.

Advantageous Effects

According to an aspect of the present disclosure, since the relative degrees of degradation of the plurality of battery cells may be diagnosed based on the measured voltage values, there is an advantage in that the relative degrees of degradation of the plurality of battery cells may be accurately and quickly diagnosed.

In addition, according to an aspect of the present disclosure, even if the SOH of the battery is not estimated, there is an advantage in that the performance of the plurality of battery cells may be comparatively diagnosed within a short time.

In addition, according to an aspect of the present disclosure, since information necessary for estimating the cause of degradation of the battery cell is provided, there is an advantage in that the information may help the user to determine a replacement timing of the battery cell or a charging and discharging condition of the battery cell.

The effects of the present disclosure are not limited to the above, and other effects not mentioned herein will be clearly understood by those skilled in the art from the appended claims.

BRIEF DESCRIPTION OF THE DRAWINGS

The accompanying drawings illustrate a preferred embodiment of the present disclosure and together with the foregoing disclosure, serve to provide further understanding of the technical features of the present disclosure, and thus, the present disclosure is not construed as being limited to the drawing.

FIG. 11 is a diagram schematically showing a method for diagnosing a degree of degradation of a battery according to another embodiment of the present disclosure.

DETAILED DESCRIPTION

It should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation.

Therefore, the description proposed herein is just a preferable example for the purpose of illustrations only, not intended to limit the scope of the disclosure, so it should be understood that other equivalents and modifications could be made thereto without departing from the scope of the disclosure.

Additionally, in describing the present disclosure, when it is deemed that a detailed description of relevant known elements or functions renders the key subject matter of the present disclosure ambiguous, the detailed description is omitted herein.

The terms including the ordinal number such as "first", "second" and the like, may be used to distinguish one element from another among various elements, but not intended to limit the elements by the terms.

Throughout the specification, when a portion is referred to as "comprising" or "including" any element, it means that the portion may include other elements further, without excluding other elements, unless specifically stated otherwise.

Furthermore, the term "control unit" described in the specification refers to a unit that processes at least one function or operation, and may be implemented by hardware, software, or a combination of hardware and software.

In addition, throughout the specification, when a portion is referred to as being "connected" to another portion, it is not limited to the case that they are "directly connected", but it also includes the case where they are "indirectly connected" with another element being interposed between them.

Hereinafter, a preferred embodiment of the present disclosure will be described in detail with reference to the accompanying drawings.

Figure 1:
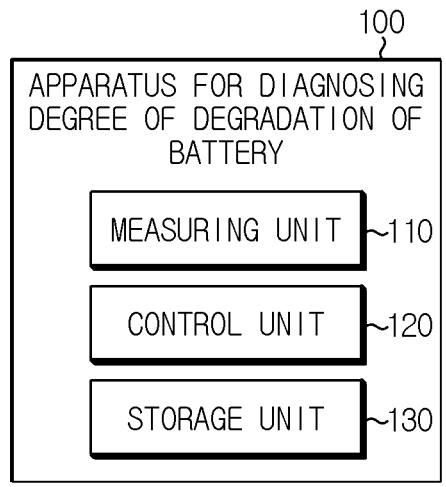
FIG. 1 is a diagram schematically showing an apparatus for diagnosing a degree of degradation of a battery according to an embodiment of the present disclosure.
Figure 2:
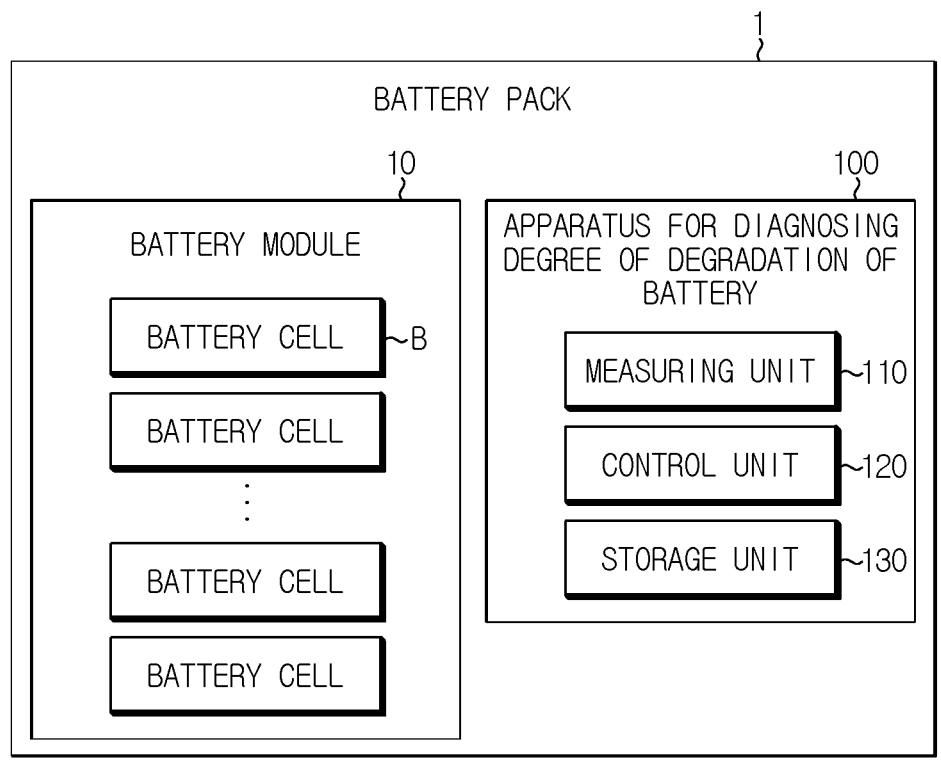
FIG. 2 is a diagram schematically showing a battery pack that includes the apparatus for diagnosing a degree of degradation of a battery according to an embodiment of the present disclosure.

FIG. 1 is a diagram schematically showing an apparatus 100 for diagnosing a degree of degradation of a battery according to an embodiment of the present disclosure. FIG. 2 is a diagram schematically showing a battery pack 1 that includes the apparatus 100 for diagnosing a degree of degradation of a battery according to an embodiment of the present disclosure.

Referring to FIG. 2, the battery pack 1 may include a battery module 10 and an apparatus 100 for diagnosing a degree of degradation of a battery.

Here, the battery module 10 may be provided by connecting one or more battery cells B in series and/or in parallel. In addition, the battery cell B refers to one independent cell that has a negative electrode terminal and a positive electrode terminal and is physically separable. For example, a pouch-type lithium polymer cell or a cylindrical cell may be regarded as the battery cell.

Figure 3:
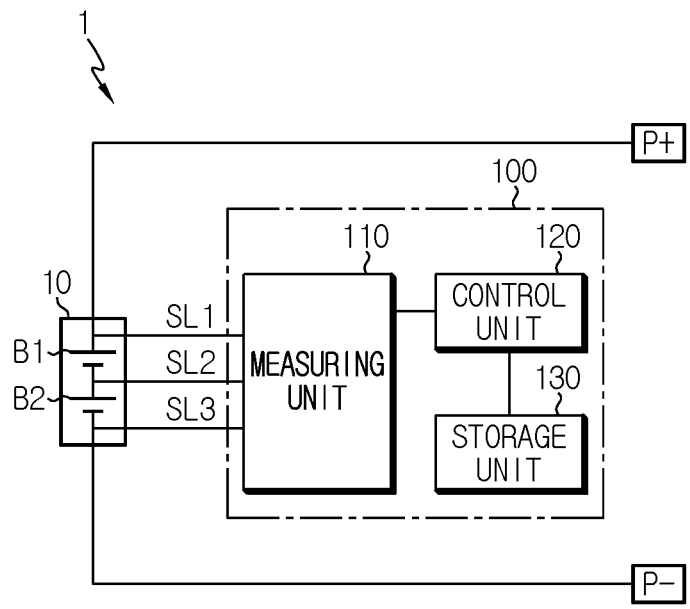
FIG. 3 is a diagram showing an exemplary configuration of the battery pack that includes the apparatus for diagnosing a degree of degradation of a battery according to an embodiment of the present disclosure.

FIG. 3 is a diagram showing an exemplary configuration of the battery pack 1 that includes the apparatus 100 for diagnosing a degree of degradation of a battery according to an embodiment of the present disclosure.

For example, in the embodiment of FIG. 3, the battery pack 1 may include a battery module 10 having a first battery cell B1 and a second battery cell B2.

Hereinafter, it will be described that the first battery cell B1 and the second battery cell B2 are provided in the battery module 10 included in the battery pack 1. However, it should be noted that it is sufficient if one or more battery cells are provided in the battery module 10, and there is no limit to the number of battery cells that can be provided.

Referring to FIG. 1, the apparatus 100 for diagnosing a degree of degradation of a battery may include a measuring unit 110 and a control unit 120.

The measuring unit 110 may be configured to measure a voltage of each of the plurality of battery cells B1, B2 in each of a plurality of cycles where discharging and charging is performed.

Specifically, the measuring unit 110 may measure the voltage of at least one of the plurality of battery cells B1, B2.

For example, in the embodiment of FIG. 3, the measuring unit 110 may be connected to the battery module 10 through a first sensing line SL1, a second sensing line SL2 and a third sensing line SL3. In addition, the measuring unit 110 may measure the voltage of the first battery cell B1 through the first sensing line SL1 and the second sensing line SL2. In addition, the measuring unit 110 may measure the voltage of the second battery cell B2 through the second sensing line SL2 and the third sensing line SL3.

In addition, the measuring unit 110 may measure the voltage of each of the plurality of battery cells B1, B2 in every cycle.

For example, it is assumed that charging and discharging of the plurality of battery cells B1 and B2 are performed in 200 cycles in total. The measuring unit 110 may measure the voltages of the plurality of battery cells B1, B2 in each of the first cycle to the $200^{th}$ cycle.

In addition, the measuring unit 110 may be configured to output a plurality of voltage information for the plurality of measured voltages.

The measuring unit 110 may convert the voltages of the plurality of battery cells B1, B2 measured using the plurality of sensing lines SL1 to SL3 into digital signals. In addition, the measuring unit 110 may output the measured voltage information by outputting the converted digital signal.

The control unit 120 may be configured to receive the plurality of voltage information.

That is, the control unit 120 may obtain the voltage information about the plurality of battery cells B1, B2 measured by the measuring unit 110 by reading the digital signal received from the measuring unit 110.

Referring to FIG. 3, the measuring unit 110 and the control unit 120 may be connected to each other through a wired line. That is, the measuring unit 110 and the control unit 120 may be configured to transmit and receive signals to and from each other through a wired line.

For example, it is assumed that the measuring unit 110 transmits the voltage information of each of the plurality of battery cells B1, B2 measured in each of the first cycle to the $200^{th}$ cycle to the control unit 120. In this case, the control unit 120 may obtain all of the voltage information in the first cycle to the voltage information in the $200^{th}$ cycle for each of the plurality of battery cells B1, B2.

The control unit 120 may be configured to calculate a voltage deviation of each cycle for each battery cell based on a reference voltage of each of the plurality of battery cells B1, B2.

Specifically, the control unit 120 may calculate the voltage deviation of each cycle for each battery cell using the following equation.

$$\Delta V = Vn - Vref \qquad \text{[Equation 1]}$$

Here, $\Delta V$ is a calculated voltage deviation [mV], Vn is a voltage [mV] measured in an $n^{th}$ cycle, Vref is a reference voltage [mV] measured in a reference cycle, and n is a positive integer.

For example, if the reference cycle is the first cycle, the reference voltage (Vref) may be a voltage measured in the first cycle. That is, the control unit 120 may calculate a voltage deviation ($\Delta V$) between the reference voltage (Vref) measured in the first cycle and the voltage (Vn) measured in the $n^{th}$ cycle, based on the voltage measured in the first cycle. In this case, the control unit 120 may diagnose the degree of degradation of the plurality of battery cells B1, B2 in the first cycle to the $n^{th}$ cycle.

Hereinafter, in the embodiment of FIG. 3, an example of the voltage deviation calculated by the control unit 120 for each of the plurality of battery cells B1, B2 will be described with reference to FIG. 4.

Figure 4:
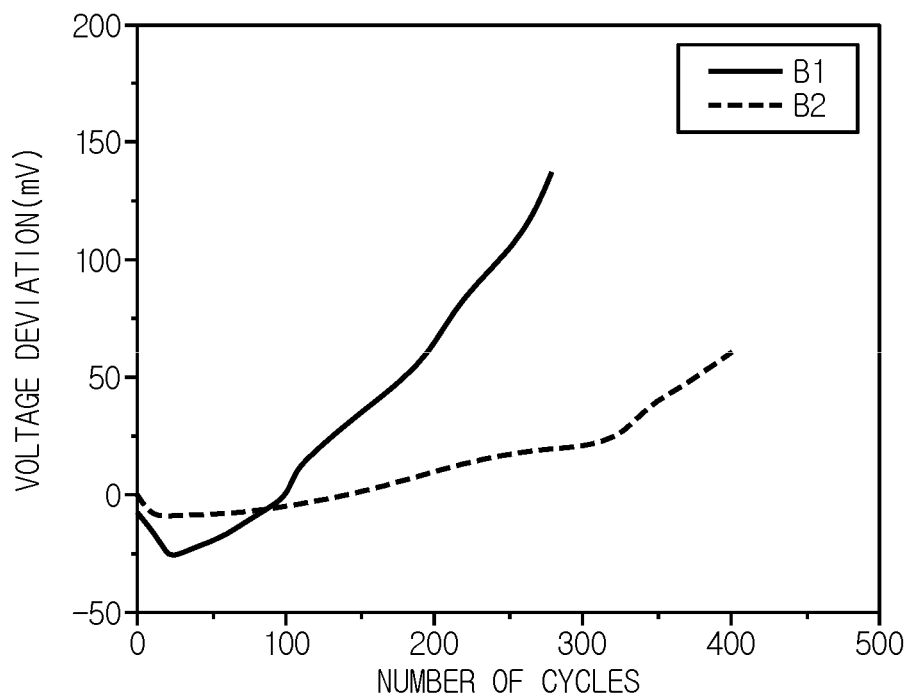
FIG. 4 is a diagram showing a voltage deviation of a plurality of battery cells provided in the battery pack that includes the apparatus for diagnosing a degree of degradation of a battery according to an embodiment of the present disclosure.

FIG. 4 is a diagram showing a voltage deviation [mV] calculated for the first battery cell B1 and the second battery cell B2 by the apparatus for diagnosing a degree of degradation of a battery according to an embodiment of the present disclosure.

Specifically, FIG. 4 shows the voltage deviation of the first battery cell B1 calculated in the first cycle to the $270^{th}$ cycle and the voltage deviation of the second battery cell B2 calculated in the first cycle to the $400^{th}$ cycle.

Referring to FIG. 4, the voltage deviation may be calculated as 0, positive or negative according to the voltage of the battery cell measured in the $n^{th}$ cycle. Preferably, in the embodiment of FIG. 4, the reference cycle may be the first cycle. That is, referring to Equation 1, since the voltage of the battery cell measured in the reference cycle serves as a standard when calculating the voltage deviation, the voltage deviations of the first battery cell B1 and the second battery cell B2 in the first cycle may be all equal to 0.

In addition, the reference voltage may be measured differently for the plurality of battery cells B1, B2. That is, the reference voltage may be set differently from each other according to the degree of degradation of the plurality of battery cells B1, B2.

The control unit 120 may be configured to select a cycle section satisfying a predetermined condition for each of the plurality of battery cells B1, B2 based on the calculated voltage deviation.

In addition, the control unit 120 may be configured to calculate a voltage deviation change rate corresponding to each of the plurality of selected cycle sections.

Here, the voltage deviation change rate may be an average change rate of the plurality of selected cycle sections.

For example, in the embodiment of FIG. 4, it is assumed that the first cycle to the $200^{th}$ cycle are selected for each of the first battery cell B1 and the second battery cell B2. In this case, the voltage deviation change rate for the first battery cell B1 may be an average change rate of the voltage deviations from the first cycle to the $200^{th}$ cycle. In addition, the voltage deviation change rate for the second battery cell B2 may be an average change rate of the voltage deviations from the first cycle to the $200^{th}$ cycle.

The control unit 120 may be configured to diagnose a relative degree of degradation of the plurality of battery cells based on the plurality of calculated voltage deviation change rates.

Preferably, the control unit 120 may compare whether the calculated voltage deviation change rate is great or small. For example, the control unit 120 may diagnose that the relative degree of degradation increases as the calculated voltage deviation change rate is greater. That is, the control unit 120 may diagnose that a battery cell having a greater calculated voltage deviation change rate among the plurality of battery cells B1, B2 is relatively further degraded.

For example, if the internal resistance of the battery cell is increased due to degradation or deterioration of the battery cell, an OCV (Open Circuit Voltage) of the battery cell that is relatively further degraded may be greater than an OCV of the battery cell that is relatively slightly degraded. Therefore, the apparatus 100 for diagnosing a degree of degradation of a battery may accurately diagnose the relative degree of degradation of the plurality of battery cells B1, B2 by comparing the magnitudes of the voltage deviation change rates of the plurality of battery cells B1, B2.

Figure 5:
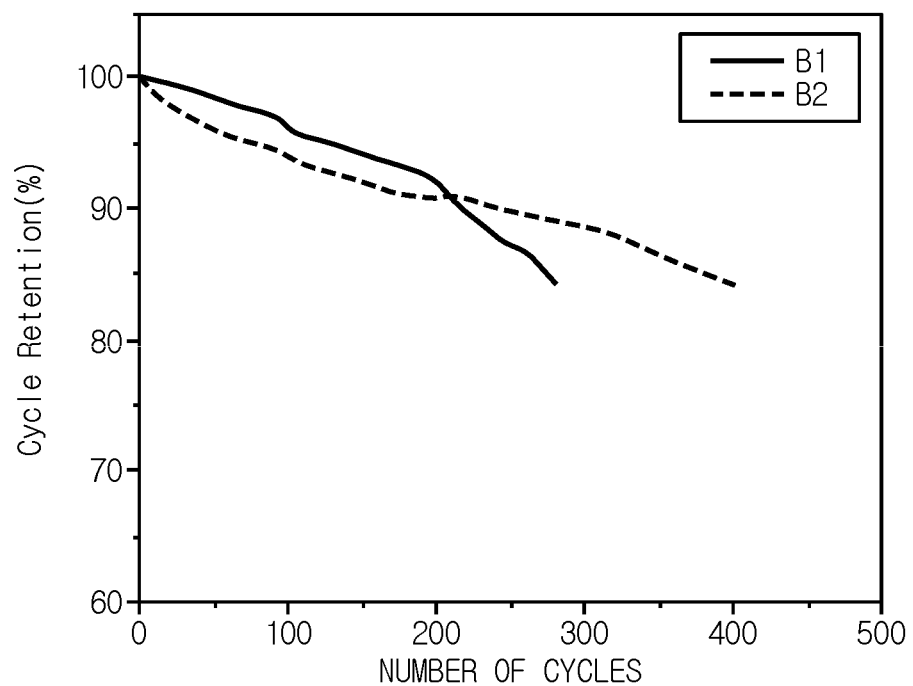
FIG. 5 is a diagram showing a cycle retention of the plurality of battery cells provided in the battery pack that includes the apparatus for diagnosing a degree of degradation of a battery according to an embodiment of the present disclosure.

FIG. 5 is a diagram showing a cycle retention of the plurality of battery cells provided in the battery pack 1 that includes the apparatus 100 for diagnosing a degree of degradation of a battery according to an embodiment of the present disclosure. Specifically, FIG. 5 is a diagram showing cycle retention when the temperature of the first battery cell B1 and the second battery cell B2 is 45° C.

In the embodiment of FIG. 5, the cycle retention of the first battery cell B1 may be rapidly decreased after the $200^{th}$ cycle. That is, referring to the cycle retention in the cycles after the $200^{th}$ cycle, it may be found that the first battery cell B1 is further degraded cell than the second battery cell B2.

However, in the embodiment of FIG. 5, if comparing only the cycle retentions in the first cycle to the $200^{th}$ cycle, the second battery cell B2 may be erroneously diagnosed as being further degraded than the first battery cell B1. In addition, referring only to the embodiment of FIG. 5, it cannot be predicted that the cycle retention of the first battery cell B1 is rapidly decreased in the cycles after the $200^{th}$ cycle.

For example, assuming that charging and discharging is performed only up to the $200^{th}$ cycle for the first battery cell B1 and the second battery cell B2, the relative degree of degradation between the first battery cell B1 and the second battery cell B2 may be incorrectly diagnosed based on the cycle retention. That is, if the relative degree of degradation is compared between the first battery cell B1 and the second battery cell B2 based on the cycle retention up to the $200^{th}$ cycle, the degree of degradation of the first battery cell B1 after the $200^{th}$ cycle is not considered at all. Therefore, through the cycle retention according to the embodiment of FIG. 5, it cannot be predicted that the first battery cell B1 may be further degraded than the second battery cell B2 after the $200^{th}$ cycle.

However, in the embodiment of FIG. 4, if the voltage deviation change rate of the first battery cell B1 and the second battery cell B2 in the first cycle to the $200^{th}$ cycle is compared, it may be found that the voltage deviation change rate of the first battery cell B1 is greater than the voltage deviation change rate of the second battery cell B2. That is, as in the embodiment of FIG. 4, if the voltage deviation change rates of the plurality of battery cells B1, B2 are compared, the relative degree of degradation of the plurality of battery cells B1 and B2 may be accurately diagnosed even if charging and discharging is performed during small cycles.

Therefore, the apparatus 100 for diagnosing a degree of degradation of a battery according to an embodiment of the present disclosure has an advantage of diagnosing the relative degree of degradation between the plurality of battery cells B1, B2 more accurately by comparing the voltage deviation change rate of each of the plurality of battery cells B1, B2, without depending on the cycle retention.

In addition, the apparatus 100 for diagnosing a degree of degradation of a battery has an advantage of diagnosing the relative degree of degradation between the plurality of battery cells B1, B2 even if the charging and discharging cycles of the plurality of battery cells B1, B2 are not performed identically. This is because the relative degree of degradation of the plurality of battery cells B1, B2 may be diagnosed based on the voltage deviation change rates of the plurality of battery cells B1, B2.

Further, based on the voltage deviation change rate of each of the plurality of battery cells B1, B2, the life expectancy of each of the plurality of battery cells B1, B2 may also be predicted.

In general, since the life of a battery cell cannot be directly measured or diagnosed, expecting the life of a battery cell in consideration of the degradation of the battery cell is a very important factor in terms of maintaining the performance of the battery cell and determining the replacement timing.

However, according to the embodiment of FIG. 5, there is a problem in that the expected lifespan of a battery cell cannot be accurately predicted depending only on cycle retention. Meanwhile, according to the embodiment of FIG. 4, the expected life of each battery cell can be easily predicted based on the voltage deviation change rate of each battery cell.

For example, in the embodiments of FIGS. 4 and 5, it is assumed that the first battery cell B1 and the second battery cell B2 are charged and discharged only up to the $200^{th}$ cycle.

According to FIG. 5, even after the $200^{th}$ cycle, it may be predicted that the cycle retention of the second battery cell B2 is smaller than the cycle retention of the first battery cell B1. That is, according to FIG. 5, it may be erroneously predicted that the degree of degradation of the second battery cell B2 is greater than the degree of degradation of the first battery cell B1 even after the $200^{th}$ cycle.

Meanwhile, according to FIG. 4, since the voltage deviation change rate of the first battery cell B1 is much greater than the voltage deviation change rate of the second battery cell B2, it may be accurately predicted that the first battery cell B1 will be more degraded than the second battery cell B2.

Therefore, the apparatus 100 for diagnosing a degree of degradation of a battery according to an embodiment of the present disclosure has an advantage of providing information (voltage deviation change rate) that allows not only to diagnose the relative degree of degradation between the plurality of battery cells but also to predict the expected life of each of the plurality of battery cells.

Meanwhile, the control unit 120 included in the apparatus 100 for diagnosing a degree of degradation of a battery may optionally include a processor, an application-specific integrated circuit (ASIC), another chipset, a logic circuit, a register, a communication modem, and a data processing device, and the like, known in the art to execute various control logics disclosed below. In addition, when the control logic is implemented in software, the control unit 120 may be implemented as a set of program modules. At this time, the program module may be stored in a memory and executed by the processor. The memory may be provided in or out of the control unit 120, and may be connected to the control unit 120 by various well-known means.

In addition, the apparatus 100 for diagnosing a degree of degradation of a battery may further include a storage unit 130. The storage unit 130 may store programs, data and the like required for the control unit 120 to diagnose degree of degradation of a battery cell. That is, the storage unit 130 may store data necessary for operation and function of each component of the apparatus 100 for diagnosing a degree of degradation of a battery, data generated in the process of performing the operation or function, or the like. The storage unit 130 is not particularly limited in its kind as long as it is a known information storage means that can record, erase, update and read data. As an example, the information storage means may include random access memory (RAM), flash memory, read-only memory (ROM), electrically erasable programmable read-only memory (EEPROM), registers, and the like. In addition, the storage unit 130 may store program codes in which processes executable by the control unit 120 are defined. For example, the voltage information of the plurality of battery cells B1, B2 received by the control unit 120 may be stored in the storage unit 130.

The measuring unit 110 may be configured to measure a voltage at a measurement point when a predetermined time passes after discharging of the plurality of battery cells B1, B2 is terminated.

Preferably, the measuring unit 110 may measure an OCV (Open Circuit Voltage) when the plurality of battery cells B1, B2 are in an idle state, after discharging of the plurality of battery cells B1, B2 is terminated.

That is, the measuring unit 110 may be configured to measure the OCV of the plurality of battery cells B1, B2 in order to reduce a measurement error caused by the internal resistance of the plurality of battery cells B1, B2.

For example, the control unit 120 may diagnose a relative degree of degradation between the plurality of battery cells B1, B2 based on the voltage deviation change rate of each of the plurality of battery cells B1, B2. If there is an error caused by the internal resistance of each of the plurality of battery cells B1, B2 in the voltage information of each of the plurality of battery cells B1, B2 measured by the measuring unit 110, the relative degree of degradation diagnosed by the control unit 120 may not be accurate.

Accordingly, the measuring unit 110 may be configured to measure the OCV of the plurality of battery cells B1, B2 when each of the plurality of battery cells B1, B2 is in an idle state.

The control unit 120 may be configured to set a voltage measured in an initial cycle of each battery cell as the reference voltage.

For example, the initial cycle may refer to the first cycle.

The specifications of the plurality of battery cells B1, B2 may not be completely identical due to various factors that may be affected during the manufacturing process. Therefore, if the reference voltages of the plurality of battery cells B1, B2 are set equally to an arbitrary voltage, there is a problem in that the states of the plurality of battery cells B1 and B2 cannot be accurately reflected. In this case, since the voltage deviation change rate of the plurality of battery cells B1, B2 is not accurately calculated, the relative degree of degradation of the plurality of battery cells B1, B2 may be erroneously diagnosed.

Accordingly, the control unit 120 may set the voltage measured in the initial cycle for each of the plurality of battery cells B1, B2 as the reference voltage of each of the plurality of battery cells B1, B2. In this case, the reference voltages of the plurality of battery cells B1, B2 may be different from each other.

In addition, the control unit 120 may be configured to calculate the voltage deviation by calculating a difference between the cell voltage of each battery cell measured in each cycle and the reference voltage.

That is, the control unit 120 may calculate a voltage deviation of each of the plurality of battery cells B1, B2 based on the reference voltage set for each of the plurality of battery cells B1, B2.

As described above, if the plurality of battery cells B1, B2 are set to have the same reference voltage, there may be a problem that the voltage information of each of the plurality of battery cells B1, B2 in the initial cycle is not reflected on the voltage deviation change rate of each of the plurality of battery cells B1, B2.

Therefore, the apparatus 100 for diagnosing a degree of degradation of a battery according to an embodiment of the present disclosure has an advantage of diagnosing the relative degree of degradation of the plurality of battery cells B1, B2 more accurately by setting the reference voltage for each of the plurality of battery cells B1, B2 individually.

The predetermined condition may be set as a condition where the calculated voltage deviation starts increasing.

The control unit 120 may be configured to select a section from a cycle where the calculated voltage deviation starts increasing to a final cycle as the cycle section among the cycles of each of the plurality of battery cells, based on the predetermined condition.

Preferably, the cycle sections respectively selected for the plurality of battery cells B1, B2 may be different from each other.

For example, in the embodiment of FIG. 4, the voltage deviation of the first battery cell B1 decreases from the first cycle to the $25^{th}$ cycle, but the voltage deviation may increase after the $26^{th}$ cycle. In addition, the voltage deviation of the second battery cell B2 decreases from the first cycle to the tenth cycle, but the voltage deviation may increase after the eleventh cycle. In this case, the control unit 120 may select the cycles from the $26^{th}$ cycle to the $270^{th}$ cycle as the cycle section for the first battery cell B1 and select the cycles from the eleventh cycle to the $400^{th}$ cycle as the cycle section for the second battery cell B2.

Preferably, in general, the degree of degradation of the battery cell may be diagnosed through the reduction of available lithium of the battery cell. The available lithium may be reduced by a lithium plating phenomenon in which lithium ions are precipitated on the surface of the negative electrode. That is, the reduction of available lithium by lithium plating may be an important factor in diagnosing the degree of degradation of a battery cell.

Meanwhile, in the initial cycle of the battery cell, the positive electrode capacity may increase as a minute crack occurs at the positive electrode active material of the battery cell. If the positive electrode capacity is increased, the reduction of available lithium by the lithium plating phenomenon may not be accurately diagnosed.

For example, in the embodiment of FIG. 4, the voltage deviation of the first battery cell B1 decreases from the first cycle to the $25^{th}$ cycle, and the voltage deviation of the second battery cell B2 decreases from the first cycle to the $10^{th}$ cycle, and these situations may be caused by the cracks generated at the positive electrode active material.

Therefore, when selecting the cycle section for calculating the voltage deviation change rate in each of the first battery cell B1 and the second battery cell B2, in the embodiment of FIG. 4, the control unit 120 may diagnose to relative degree of degradation between the plurality of battery cells B1, B2 according to the reduction of available lithium by excluding the cycle section in which the voltage deviation decreases.

For example, in the embodiment of FIG. 4, the voltage deviation change rate of the $26^{th}$ cycle to the $270^{th}$ cycle of the first battery cell B1 may be 0.67. In addition, the voltage deviation change rate of the eleventh cycle to the $400^{th}$ cycle of the second battery cell B2 may be 0.22. The control unit 120 may diagnose that the first battery cell B1 is further degraded than the second battery cell B2 by comparing the calculated voltage deviation change rates.

The apparatus 100 for diagnosing a degree of degradation of a battery according to an embodiment of the present disclosure has an advantage of diagnosing the relative degree of degradation between the plurality of battery cells B1, B2 caused by the reduction of available lithium more accurately by excluding the section in which cracks occur at the positive electrode active material from the cycle section subject to the diagnosis of the degree of degradation.

Figure 6:
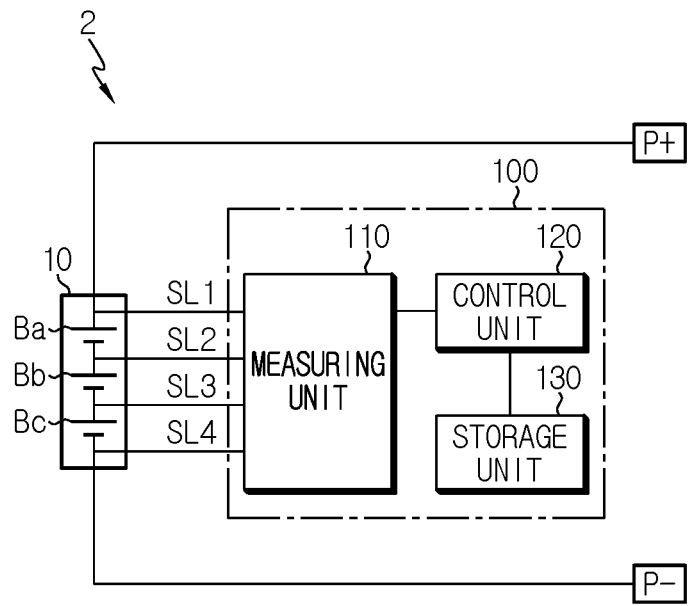
FIG. 6 is a diagram showing an exemplary configuration of another battery pack that includes the apparatus for diagnosing a degree of degradation of a battery according to an embodiment of the present disclosure.
Figure 7:
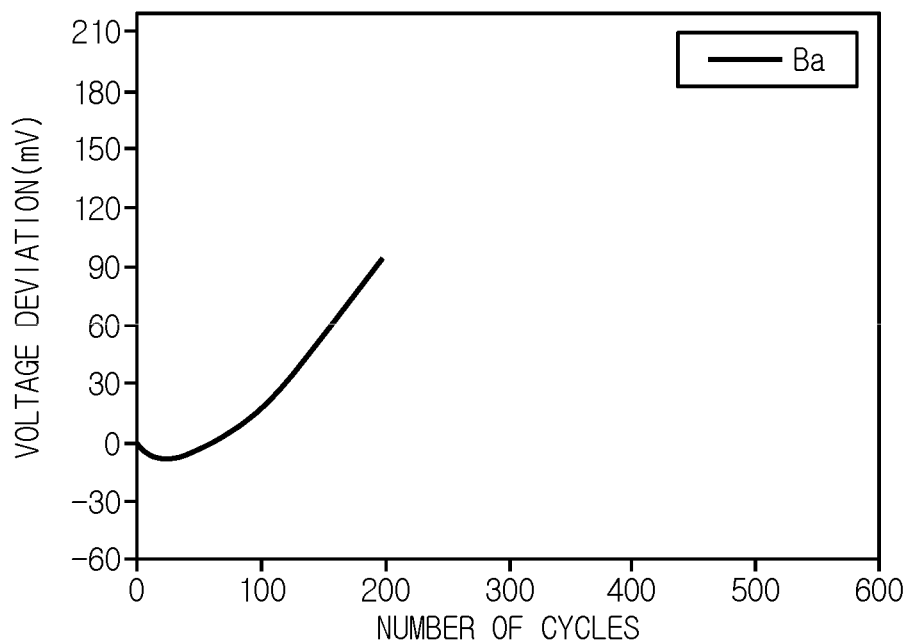
FIGS. 7 to 9 are diagrams showing a voltage deviation of a plurality of battery cells provided in another battery pack that includes the apparatus for diagnosing a degree of degradation of a battery according to an embodiment of the present disclosure.
Figure 8:
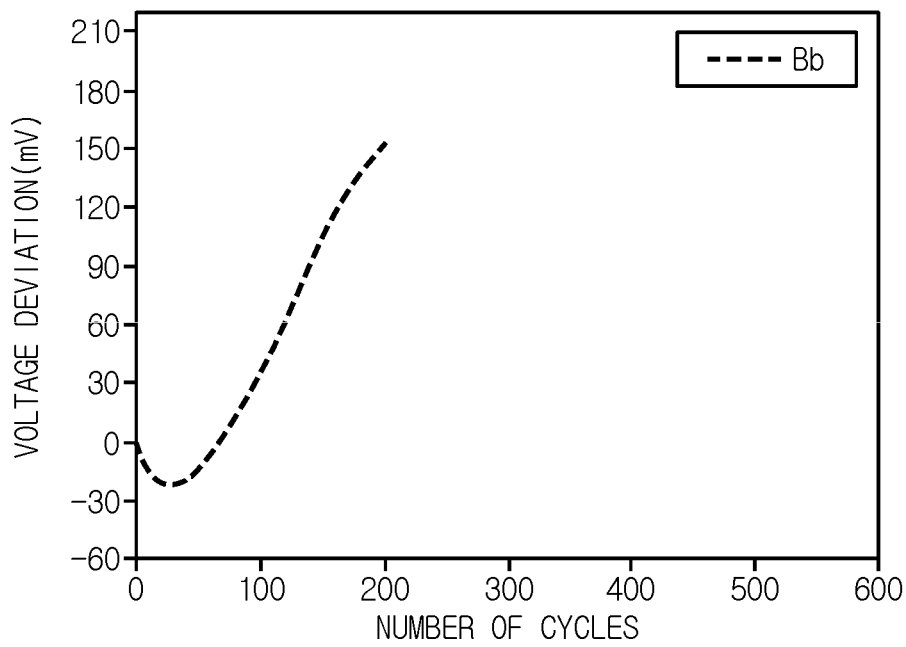
Figure 9:
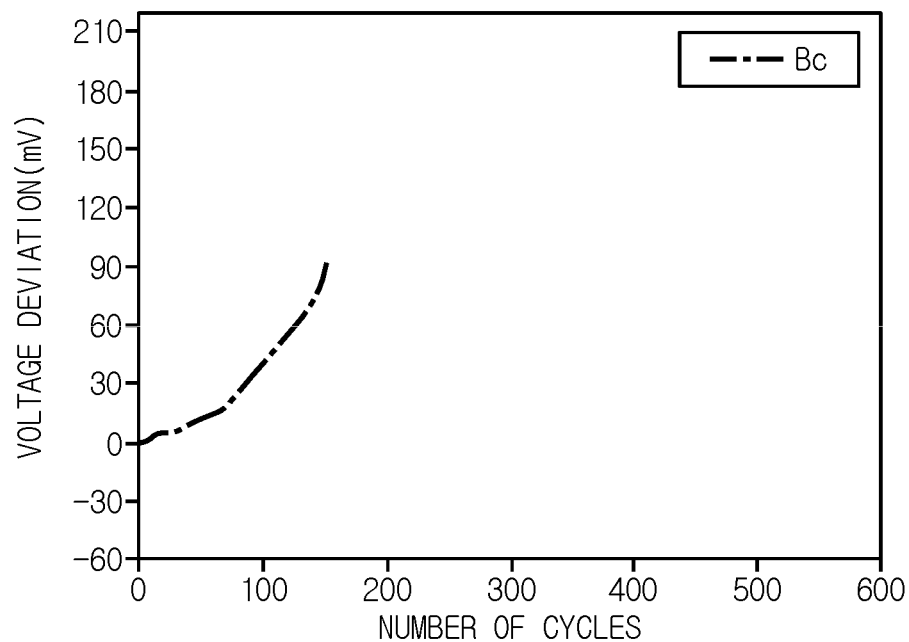

FIG. 6 is a diagram showing an exemplary configuration of another battery pack 2 that includes the apparatus 100 for diagnosing a degree of degradation of a battery according to an embodiment of the present disclosure. FIGS. 7 to 9 are diagrams showing a voltage deviation of a plurality of battery cells provided in another battery pack 2 that includes the apparatus 100 for diagnosing a degree of degradation of a battery according to an embodiment of the present disclosure.

Referring to FIG. 6, the battery pack 2 may include a battery module 10 having a first battery cell Ba, a second battery cell Bb and a third battery cell Bc.

In the embodiments of FIGS. 7 and 8, the voltage deviations of the first battery cell Ba and the second battery cell Bb may decrease from the first cycle to the $20^{th}$ cycle. In the embodiment of FIG. 9, the voltage deviation of the third battery cell Bc may not decrease from the first cycle, different from the first battery cell Ba and the second battery cell Bb.

For example, the voltage deviation change rate after the $21^{st}$ cycle of the first battery cell Ba may be 0.776, the voltage deviation change rate after the $21^{st}$ cycle of the second battery cell Bb may be 1.14, and the voltage deviation change rate after the first cycle of the third battery cell Bc may be 0.769.

By comparing the voltage deviation change rates of the first battery cell Ba, the second battery cell Bb and the third battery cell Bc with each other, the control unit 120 may diagnose that the second battery cell Bb is most degraded and the third battery cell Bc is least degraded.

Figure 10:
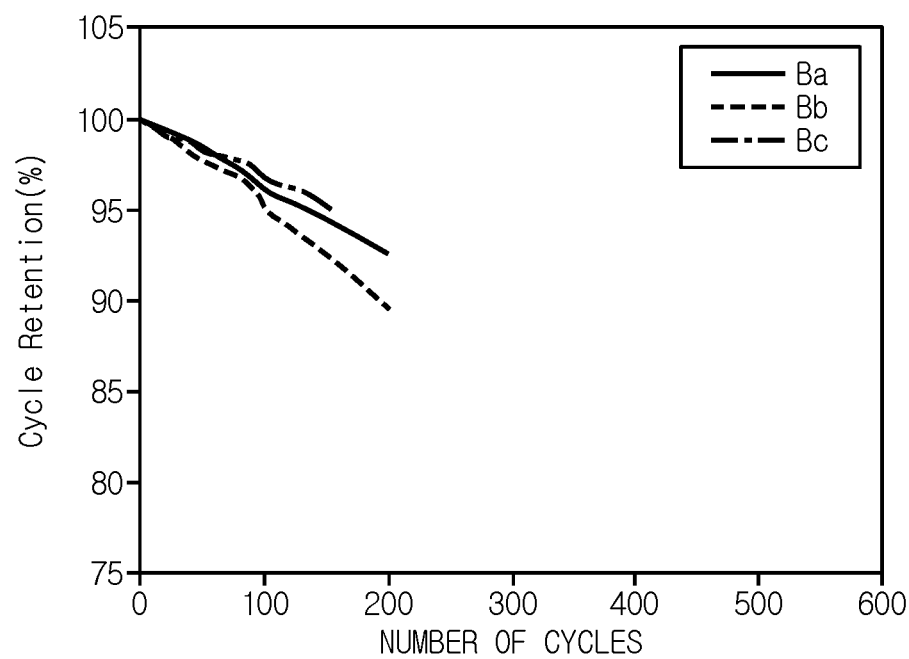
FIG. 10 is a diagram showing a cycle retention of the plurality of battery cells provided in another battery pack that includes the apparatus for diagnosing a degree of degradation of a battery according to an embodiment of the present disclosure.

FIG. 10 is a diagram showing a cycle retention of the plurality of battery cells provided in another battery pack 2 that includes the apparatus 100 for diagnosing a degree of degradation of a battery according to an embodiment of the present disclosure.

Specifically, FIG. 10 is a diagram showing a cycle retention when temperatures of the first battery cell Ba, the second battery cell Bb and the third battery cell Bc are 45° C.

Even with reference to FIG. 10, it may be found that the plurality of battery cells Ba, Bb, Bc are degraded more in the order of the third battery cell Bc, the first battery cell Ba and the second battery cell Bb.

Therefore, even if the cycle retention for the plurality of battery cells Ba, Bb, Bc is not obtained, the apparatus 100 for diagnosing a degree of degradation of a battery has an advantage of quickly and accurately diagnosing the relative degree of degradation of the plurality of battery cells Ba, Bb, Bc by calculating the voltage deviation change rate of each of the plurality of battery cells Ba, Bb, Bc.

The predetermined condition may be set as a cycle after a preset cycle from the initial cycle.

The control unit 120 may be configured to select a plurality of cycles after the preset cycle from the initial cycle as the cycle section among the cycles of each of the plurality of battery cells, based on the predetermined condition.

Unlike the above embodiment, the control unit 120 may also select a cycle section that is a target for diagnosing the relative degree of degradation of the plurality of battery cells B1, B2 as the cycle section after the preset cycle.

For example, the predetermined condition may be a condition in which the cycle section is selected after the first cycle to the $100^{th}$ cycle. That is, the control unit 120 may select a cycle section from the $111^{th}$ cycle.

If the cycle section is selected according to such a predetermined condition, a relative degree of degradation of a plurality of battery cells B1, B2 in the cycle section corresponding to the predetermined condition may be diagnosed.

Therefore, the apparatus 100 for diagnosing a degree of degradation of a battery according to an embodiment of the present disclosure has an advantage of diagnosing the relative degree of degradation of the plurality of battery cells B1, B2 for the cycle section selected based on the preset cycle.

Hereinafter, an embodiment in which the apparatus 100 for diagnosing a degree of degradation of a battery according to an embodiment of the present disclosure compares the relative degree of degradation of the plurality of battery cells in a predetermined cycle section with each other will be described.

The control unit 120 may be configured to divide the plurality of selected cycles into a plurality of unit sections.

For example, in the embodiment of FIG. 4, it is assumed that the first battery cell B1 is charged and discharged until the $270^{th}$ cycle, and the second battery cell B2 is charged and discharged until the $400^{th}$ cycle. The control unit 120 may divide the plurality of selected cycles into a plurality of unit sections by every 50 cycles from the first cycle for the first battery cell B1 and the second battery cell B2.

Specifically, the control unit 120 may set first to $50^{th}$ cycles as a first unit section, $51^{st}$ to $100^{th}$ cycles as a second unit section, and $101^{st}$ to $150^{th}$ cycle as a third unit section. In this way, the control unit 120 may divide the plurality of selected cycles into first to sixth unit sections for the first battery cell B1 and first to eighth unit sections for the second battery cell B2.

In addition, the control unit 120 may be configured to calculate an average section change rate of voltage deviation corresponding to each of the divided plurality of unit sections.

For example, in the former embodiment, the control unit 120 may calculate an average section change rate of the voltage deviation for each of the first to sixth unit sections of the first battery cell B1. In addition, the control unit 120 may calculate an average section change rate of the voltage deviation for each of the first to eighth unit sections of the second battery cell B2.

The control unit 120 may be configured to diagnose a relative degree of degradation in each of the plurality of unit sections for the plurality of battery cells based on a result of comparing the average section change rates calculated corresponding to the same unit section.

That is, the control unit 120 may diagnose a relative degree of degradation for a corresponding unit section by comparing the calculated average section change rates calculated for the same unit section of the first battery cell B1 and the second battery cell B2.

Preferably, since there is a region where the voltage deviation decreases in the first unit section of the first battery cell B1 and the second battery cell B2, the control unit 120 may exclude diagnosing the relative degree of degradation for the first unit section of the first battery cell B1 and the second battery cell B2. However, more preferably, the control unit 120 may compare the average section change rate of the voltage deviation in a section where the voltage deviation increases, in the first unit section of the first battery cell B1 and the second battery cell B2. Accordingly, the control unit 120 may compare the relative degree of degradation of the first battery cell B1 and the second battery cell B2 in the first unit section with each other.

The control unit 120 may identify a unit section in which a difference in the relative degree of degradation between the plurality of battery cells B1, B2 is increased. That is, the control unit 120 may compare the relative degree of degradation between the plurality of battery cells B1, B2 in various aspects by comparing the degree of reduction in available lithium of the plurality of battery cells B1, B2 in each unit section with each other.

Therefore, the apparatus 100 for diagnosing a degree of degradation of a battery according to an embodiment of the present disclosure has an advantage of comparing the degree of degradation of the plurality of battery cells B1, B2 with each other for each unit section by diagnosing the relative degree of degradation of the plurality of battery cells B1, B2 for each unit section.

Hereinafter, an embodiment in which the apparatus 100 for diagnosing a degree of degradation of a battery according to an embodiment of the present disclosure diagnoses whether the degradation of each battery cell is accelerated will be described. Specifically, an embodiment in which the control unit 120 may diagnose a unit section where degradation is accelerated for one battery cell will be described below.

The control unit 120 may be configured to select a target cell among the plurality of battery cells B1, B2.

The target cell may be sequentially set for each of the plurality of battery cells B1, B2, and a specific battery cell may also be selected as the target cell by setting according to an external input.

For example, in the embodiment of FIG. 4, it is assumed that the control unit 120 selects the second battery cell B2 as the target cell.

The control unit 120 may be configured to divide a plurality of cycles corresponding to the selected target cell into a plurality of unit sections. In addition, the control unit 120 may be configured to calculate an average section change rate of the voltage deviation corresponding to each of the plurality of divided unit sections.

For example, as in the former embodiment, the control unit 120 may divide the plurality of cycles for the second battery cell B2 into a plurality of unit sections by 50 cycles. In addition, the control unit 120 may compare the average section change rate of the plurality of unit sections for the second battery cell B2 with each other. Even in this case, the control unit 120 may exclude the first unit section including a section where the voltage deviation of the second battery cell B2 decreases, when comparing the average section change rate between the plurality of unit sections.

The control unit 120 may be configured to diagnose whether the degradation of the target cell is accelerated based on a result of comparing the calculated average section change rate.

That is, if the average section change rates of the plurality of unit sections of the target cell are compared with each other, the unit section where the degradation of the target cell has progressed most may be identified.

Preferably, the control unit 120 may be configured to diagnose that the degradation of the target cell is accelerated if the average section change rate increases as the cycles progress. That is, as the average section change rate increases, the control unit 120 may diagnose that the degradation of the target cell has accelerated in the corresponding unit section.

For example, in the embodiment of FIG. 4, the average section change rate of the second battery cell B2 may rapidly increases in the seventh unit section (the $301^{st}$ cycle to the $350^{th}$ cycle), and the average section change rate may be largest at the eighth unit section (the $351^{st}$ cycle to the $400^{th}$ cycle). In this case, the control unit 120 may diagnose that the degradation of the second battery cell B2 is accelerated from the seventh unit section and further accelerated in the eighth unit section.

Further, the control unit 120 may predict that the degradation of the second battery cell B2 will be accelerated more and more even after the eighth unit section in light of the tendency that the degradation of the second battery cell B2 is further accelerated.

Based on the above information diagnosed by the control unit 120, appropriate measures may be taken to lower the degradation rate for each of the plurality of battery cells B1, B2.

For example, for a battery cell in which the degradation is accelerated, the available voltage range may be reduced. That is, in a battery cell in which the degradation is accelerated, the upper limit of the voltage that may be charged to the maximum is decreased, and the lower limit of the voltage that may be discharged to the maximum is increased, so that the progress of degradation may be delayed. In addition, for a battery cell in which the degradation is accelerated, the magnitude of the charging current and/or the discharge current may be adjusted.

That is, the apparatus 100 for diagnosing a degree of degradation of a battery according to an embodiment of the present disclosure may not only diagnose the relative degree of degradation of the plurality of battery cells B1, B2, but also diagnose the cycle section in which the degradation of each battery cell is accelerated. Therefore, there is an advantage in that the relative degree of degradation of the plurality of battery cells B1, B2 may be diagnosed in more various aspects.

The apparatus 100 for diagnosing a degree of degradation of a battery according to the present disclosure may be applied to a BMS (Battery Management System). That is, the BMS according to the present disclosure may include the apparatus 100 for diagnosing a degree of degradation of a battery described above. In this configuration, at least some of the components of the apparatus 100 for diagnosing a degree of degradation of a battery may be implemented by supplementing or adding functions of components included in a conventional BMS. For example, the measuring unit 110, the measuring unit 120 and the storage unit 130 of the apparatus 100 for diagnosing a degree of degradation of a battery may be implemented as components of the BMS.

In addition, the apparatus 100 for diagnosing a degree of degradation of a battery according to the present disclosure may be provided to a battery pack 1. For example, as shown in FIG. 3 or 6, the battery pack 1, 2 according to the present disclosure may include the apparatus 100 for diagnosing a degree of degradation of a battery and at least one battery cell. In addition, the battery pack may further include electrical equipment (a relay, a fuse, etc.), a case, and the like.

FIG. 11 is a diagram schematically showing a method for diagnosing a degree of degradation of a battery according to another embodiment of the present disclosure.

Referring to FIG. 11, the method for diagnosing a degree of degradation of a battery may include a voltage measuring step (S100), a voltage deviation calculating step (S200), a cycle section selecting step (S300), a change rate calculating step (S400) and a degree of degradation diagnosing step (S500).

The voltage measuring step S100 is a step of measuring a voltage of each of a plurality of battery cells in each of a plurality of cycles where discharging and charging is performed, and may be performed by the measuring unit 110.

Preferably, the measuring unit 110 may measure an OCV of each of the plurality of battery cells.

For example, in the embodiment of FIG. 3, the voltage value of each of the plurality of battery cells B1, B2 measured by the measuring unit 110 may be transmitted to the control unit 120.

The voltage deviation calculating step (S200) is a step of calculating a voltage deviation in each cycle for each of the battery cells B1, B2 based on a reference voltage of each of the plurality of battery cells B1, B2, and may be performed by the control unit 120.

For example, in the embodiment of FIG. 4, the control unit 120 may set the reference voltage for each of the plurality of battery cells based on the voltage in the initial cycle (e.g., the first cycle) of each of the plurality of battery cells B1, B2.

In addition, the control unit 120 may calculate a voltage deviation for each of the plurality of battery cells B1, B2 based on the reference voltage set for each of the plurality of battery cells B1, B2.

The cycle section selecting step (S300) is a step of selecting a cycle section that satisfies a predetermined condition for each of the plurality of battery cells B1, B2, based on the voltage deviation calculated in the voltage deviation calculating step (S200), and may be performed by the control unit 120.

Preferably, when selecting a cycle section for diagnosing the relative degree of degradation of the plurality of battery cells B1, B2, the control unit 120 may exclude a cycle section where the voltage deviation of each of the plurality of battery cells B1, B2 decreases.

For example, in the embodiment of FIG. 4, the control unit 120 may exclude the cycle section from the first cycle to the $25^{th}$ cycle for the first battery cell B1. In addition, the control unit 120 may exclude the cycle section from the first cycle to the tenth cycle for the second battery cell B2.

As described above, this is to prevent the relative degree of degradation of the plurality of battery cells B1, B2 from being affected by micro cracks of the positive electrode active material generated in the initial cycle of the battery cell.

That is, when selecting a cycle section for diagnosing the relative degree of degradation of the plurality of battery cells B1, B2, the control unit 120 may exclude the cycle section where the voltage deviation of each of the plurality of battery cells B1, B2 decreases, thereby comparatively diagnosing the degree of degradation that proceeds in a state where the available lithium of each of the plurality of battery cells B1, B2 is reduced.

The change rate calculating step (S400) is a step of calculating a voltage deviation change rate corresponding to each of the plurality of selected cycle sections, and may be performed by the control unit 120.

For example, the control unit 120 may calculate an average change rate for the voltage deviation of the plurality of selected cycle sections. Here, the average change rate may be a change rate between the voltage deviation of the start cycle and the voltage deviation of the final cycle among the plurality of cycle sections as described above.

The degree of degradation diagnosing step (S500) is a step of diagnosing the relative degree of degradation of the plurality of battery cells based on the plurality of calculated voltage deviation change rates, and may be performed by the control unit 120.

Preferably, the control unit 120 may diagnose that the battery cell is degraded more as the plurality of calculated voltage deviation change rate is greater.

For example, in the embodiments of FIGS. 4 and 5, it is assumed that charging and discharging is performed only in the first cycle to the $200^{th}$ cycle for the first battery cell B1 and the second battery cell B2. In this case, according to the embodiment of FIG. 5, it is diagnosed that the second battery cell B2 is further degraded in the first cycle to the $200^{th}$ cycle, and it cannot be predicted that the first battery cell B1 is degraded rapidly after the $200^{th}$ cycle.

Meanwhile, according to the embodiment of FIG. 4, since the voltage deviation change rate of the first battery cell B1 is much greater than the voltage deviation change rate of the second battery cell B2 after the $25^{th}$ cycle, even if the cycles proceed further after the $200^{th}$ cycle, it can be predicted that the relative degree of degradation of the first battery cell B1 will be greater.

Therefore, the method for diagnosing a degree of degradation of a battery has an advantage of accurately diagnosing and predicting the relative degree of degradation of the plurality of battery cells B1, B2 in various aspects.

In addition, the method for diagnosing a degree of degradation of a battery has an advantage of predicting even the relative degree of the relative degree of the plurality of battery cells B1, B2 in subsequent cycles, which cannot be predicted in the cycle retention, by using the voltage deviation change rate of each of the plurality of battery cells B1, B2.

Further, there is an advantage that the expected lifespan of each of the plurality of battery cells B1, B2 may be predicted based on the voltage deviation change rate of each of the plurality of battery cells B1, B2.

The embodiments of the present disclosure described above are not necessarily implemented by an apparatus and method but may also be implemented through a program for realizing functions corresponding to the configuration of the present disclosure or a recording medium on which the program is recorded. Such implementation may be easily performed by those skilled in the art from the above description of the embodiments.

The present disclosure has been described in detail. However, it should be understood that the detailed description and specific examples, while indicating preferred embodiments of the disclosure, are given by way of illustration only, since various changes and modifications within the scope of the disclosure will become apparent to those skilled in the art from this detailed description.

Additionally, many substitutions, modifications and changes may be made to the present disclosure described hereinabove by those skilled in the art without departing from the technical aspects of the present disclosure, and the present disclosure is not limited to the above-described embodiments and the accompanying drawings, and each embodiment may be selectively combined in part or in whole to allow various modifications.

REFERENCE SIGNS 1, 2: battery pack
10: battery module
100: apparatus for diagnosing a degree of degradation of a battery
110: measuring unit
120: control unit
130: storage unit

What is claimed is:

1. An apparatus for diagnosing a degree of degradation of a battery, comprising:
    a voltage sensor configured to:
        measure a voltage of each of a plurality of battery cells in each of a plurality of cycles where charging and discharging is performed, and
        output voltage information about the plurality of measured voltages of the plurality of battery cells in the plurality of cycles; and
    a control unit configured to:
        receive the voltage information,
        for each battery cell:
            for each cycle of the battery cell, calculate a voltage deviation based on a reference voltage of the battery cells during the cycle,
            select a plurality of cycle sections among the plurality of cycles, each of the plurality of cycle sections satisfying a predetermined condition based on the plurality of calculated voltage deviations, and
            calculate a voltage deviation change rate corresponding to each of the plurality of selected cycle sections, and
        diagnose a relative degree of degradation of the plurality of battery cells based on the plurality of calculated voltage deviation change rates.

2. The apparatus according to claim 1, wherein the voltage sensor is configured to measure the voltage of the plurality of battery cells in response to passage of a predetermined amount of time after termination of discharging of the plurality of battery cells.

3. The apparatus according to claim 2, wherein the voltage deviation is a difference between a cell voltage of the battery cell and the reference voltage.

4. The apparatus according to claim 1, wherein the predetermined condition is an increase in the calculated voltage deviation.

5. The apparatus according to claim 1, wherein the predetermined condition is passage of a preset number of cycles from an initial cycle.

6. The apparatus according to claim 1, wherein the control unit is configured to calculate an average change rate of the voltage deviation corresponding to each of the plurality of selected cycle sections.

7. The apparatus according to claim 6, wherein the control unit is configured to diagnose a relative degree of degradation of the plurality of battery cells based on a comparison of the respective average change rates calculated for the plurality of battery cells.

8. The apparatus according to claim 7, wherein an increase in the battery degree of degradation corresponds to an increase in the calculated voltage deviation change rate.

9. The apparatus according to claim 1, wherein the control unit is configured to:
    divide the plurality of selected cycles into a plurality of unit sections,
    calculate an average section change rate of the voltage deviation for each of the plurality of divided unit sections, and
    diagnose a relative degree of degradation of the plurality of battery cells for each of plurality of unit sections, wherein for each unit section, the respective relative degree of degradation of the unit section is based on a result of comparing the average section change rates calculated for the unit section.

10. The apparatus according to claim 1, wherein the control unit is configured to:
    select a target cell among the plurality of battery cells,
    divide a plurality of cycles corresponding to the selected target cell into a plurality of unit sections,
    calculate an average section change rate of the voltage deviation corresponding to each of the plurality of divided unit sections, and
    diagnose whether degradation of the target cell is accelerated based on a comparison of the calculated average section change rates.

11. The apparatus according to claim 10, wherein the control unit is configured to diagnose that degradation of the target cell has accelerated during a given unit section in response to the plurality of calculated average section change rates increasing as the plurality of cycles of the given unit section proceed.

12. A battery pack, comprising the apparatus according to claim 1.

13. A method for diagnosing a degree of degradation of a battery, comprising:
- measuring, by a voltage sensor, a voltage of each of a plurality of battery cells in each of a plurality of cycles where charging and discharging is performed;
- outputting, by the voltage sensor, voltage information about the plurality of measured voltages of the plurality of battery cells in the plurality of cycles;
- receiving, by a control unit, the voltage information;
- for each battery cell:
    - for each cycle of the battery cell, calculating, by the control unit, a voltage deviation based on a reference voltage of the battery cells during the cycle;
    - selecting, by the control unit, a plurality of cycle sections among the plurality of cycles, each of the plurality of cycle sections satisfying a predetermined condition based on the calculated plurality of voltage deviations;
    - calculating, by the control unit, a voltage deviation change rate corresponding to each of the plurality of selected cycle sections; and
- diagnosing, by the control unit, a relative degree of degradation of the plurality of battery cells based on the plurality of calculated voltage deviation change rates.

* * * * *